US012635421B2

(12) United States Patent
Green

(10) Patent No.: US 12,635,421 B2
(45) Date of Patent: May 19, 2026

(54) METHOD OF FORMING A HALL SENSOR WITH PERFORMANCE CONTROL

(71) Applicant: TEXAS INSTRUMENTS INCORPORATED, Dallas, TX (US)

(72) Inventor: Keith R. Green, Prosper, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/094,631

(22) Filed: Jan. 9, 2023

(65) Prior Publication Data

US 2023/0165165 A1 May 25, 2023

Related U.S. Application Data

(62) Division of application No. 16/370,944, filed on Mar. 30, 2019, now Pat. No. 11,588,101.

(51) Int. Cl.
| | |
|---|---|
| *H10N 52/80* | (2023.01) |
| *H10N 52/00* | (2023.01) |
| *H10N 52/01* | (2023.01) |
| *H10N 59/00* | (2023.01) |

(52) U.S. Cl.
CPC ............. *H10N 52/80* (2023.02); *H10N 52/01* (2023.02); *H10N 52/101* (2023.02); *H10N 59/00* (2023.02)

(58) Field of Classification Search
CPC ...... H10N 50/01; H10N 50/101; H10N 50/80; H10N 59/00
See application file for complete search history.

(56) References Cited

U.S. PATENT DOCUMENTS

| | | | |
|---|---|---|---|
| 6,492,697 | B1 | 12/2002 | Plagens et al. |
| 10,050,082 | B1 * | 8/2018 | Liu ......................... H10N 52/01 |
| 10,424,616 | B1 * | 9/2019 | Sun ......................... H10B 61/00 |
| 2009/0206424 | A1 | 8/2009 | Killian et al. |
| 2017/0125479 | A1 * | 5/2017 | Green .................... H10N 59/00 |
| 2017/0288131 | A1 | 10/2017 | Sun et al. |
| 2018/0031644 | A1 | 2/2018 | Ausserlechner |

(Continued)

OTHER PUBLICATIONS

D. Killat, F. Umbach, J. v. Kluge, R. Schmitz and W. Langheinrich, "Sensitivity and Noise of MOS Magnetic Field Effect Transistors," ESSDERC '96: Proceedings of the 26th European Solid State Device Research Conference, Bologna, Italy, 1996, pp. 111-114.

(Continued)

*Primary Examiner* — Yara B Green
*Assistant Examiner* — Christopher M Roland
(74) *Attorney, Agent, or Firm* — Andrew R. Ralston; Frank D. Cimino

(57) ABSTRACT

A Hall sensor includes a Hall well, such as an implanted region in a surface layer of a semiconductor structure, and four doped regions spaced apart from one another in the implanted region. The implanted region and the doped regions include majority carriers of the same conductivity type. The sensor also includes a dielectric layer that extends over the implanted region, and an electrode layer over the dielectric layer to operate as a control gate to set or adjust the sensor performance. A first supply circuit provides a first bias signal to a first pair of the terminals, and a second supply circuit provides a second bias signal to the electrode layer.

15 Claims, 14 Drawing Sheets

(56)　　　　　References Cited

U.S. PATENT DOCUMENTS

2020/0292631 A1　　9/2020　Sun et al.
2022/0075009 A1\*　3/2022　Green　.................... H10N 59/00

OTHER PUBLICATIONS

M. Daricek, M. Donoval, A. Satka and T. Kosik, "Characterization of MagFET structures," 2008 15th IEEE International Conference on Electronics, Circuits and Systems, St. Julien's, 2008, pp. 1233-1236.
R. Klima, "Three-Dimensional Device Simulation with Minimos-NT," Ph.D. dissertation, Technische Universität Wien, 2002, section 4.2.1, http://www.iue.tuwien.ac.at/phd/klima/node72.html, accessed Jun. 26, 2019.
Killat et al., "Sensitivity and Noise of MOS Magnetic Field Effect Transistors", sponsored by the Deutsche Forschungsgemeinschafl {DFG), ESSDERC '96: Proceedings of the 26th European Solid State Device Research Conference, pp. 111-114, 1996.
Daricek, et al., "Characterization of MagFET structures", 2008 15th IEEE International Conference on Electronics, Circuits and Systems, pp. 1233-1236, 2008.

\* cited by examiner

500

502 — IMPLANT NBL

503 — IMPLANT PBL

504 — EPITAXIAL SILICON DEPOSITION

505 — IMPLANT HALL NWELL

506 — STI OR LOCOS

508 — FORM GATE DIELECTRIC OVER HALL NWELL

510 — FORM GATE ELECTRODE OVER GATE DIELECTRIC

512 — GATE ETCH

514 — FORM SIDEWALL SPACERS

516 — SOURCE/DRAIN IMPLANTS

518 — SILICIDATION

520 — METALLIZATION

522 — DIE SINGULATION AND PACKAGING

METHOD OF FORMING A HALL SENSOR WITH PERFORMANCE CONTROL

CROSS REFERENCE TO RELATED APPLICATIONS

This application is a divisional of U.S. Pat. No. 11,588, 101, issued Feb. 21, 2023 (application Ser. No. 16/370,944), which is incorporated herein by reference in its entirety.

BACKGROUND

Hall sensors provide magnetic field sensing capabilities through causing a bias current to flow in a Hall well or other implanted region of a semiconductor structure, and sensing a Hall voltage across two terminals of the implanted region. A magnetic field in the implanted region interacts with bias current flow to generate the Hall voltage through Lorentz force interactions, and the sensed Hall voltage is proportional to the applied magnetic field. Although the magnetic sensitivity, resistance, offset, noise and bandwidth are generally static for a given Hall sensor construction, these properties can vary with environmental conditions such as temperature and/or stress.

SUMMARY

This summary is provided to introduce a brief selection of disclosed concepts in a simplified form that are further illustrated and described below. This summary is not intended to limit the scope of the claimed subject matter.

Disclosed aspects include a semiconductor device with an implanted region in a surface layer of a semiconductor structure, and four terminals that electrically contact the implanted region at respective locations spaced apart from one another. The device includes a dielectric layer over the implanted region, and an electrode layer over the dielectric layer. In one example, the terminals include respective doped regions in the implanted region. In one example, the doped regions and the implanted region include dopants of the same conductivity type. In one example the dielectric layer is in contact with the implanted region, and the electrode layer is in contact with the dielectric layer. The semiconductor device in one example further includes a first supply circuit connected to provide a non-zero first bias signal to a first pair of the terminals, and a second supply circuit connected to provide a non-zero second bias signal to the electrode layer. In one example, the electrode layer includes doped polysilicon.

Another aspect includes a magnetic sensor, with an implanted region in a surface layer of a semiconductor structure, and four doped regions spaced apart from one another in the implanted region, where the implanted region and the doped regions including majority carriers of the same conductivity type. The sensor also includes a dielectric layer having a thickness of 1200 Å or less on the implanted region, an electrode layer on the dielectric layer, a first supply circuit connected to provide a non-zero first bias signal to a first pair of the terminals, and a second supply circuit connected to provide a non-zero second bias signal to the electrode layer.

A further aspect provides a method that includes performing a first implantation process that implants dopants to form an implanted region in a semiconductor surface layer of a semiconductor structure, performing a second implantation process that implants dopants to form four doped regions spaced apart from one another in the implanted region, where the first and second implantation processes implant dopants are the same conductivity type. The method also includes forming a dielectric layer over the implanted region, and forming an electrode layer over the dielectric layer.

Another aspect provides a method of sensing a magnetic field. The method includes applying a first bias signal to a first pair of terminals at first and second spaced apart doped regions in an implanted region of a semiconductor structure, applying a second bias signal to an electrode layer above a dielectric layer on the implanted region, and sensing a Hall voltage signal at a second pair of terminals at third and fourth spaced apart doped regions in the implanted region. In one example, the method also includes adjusting the second bias signal based on an external input or a sensed operating condition.

DETAILED DESCRIPTION

Figure 1:
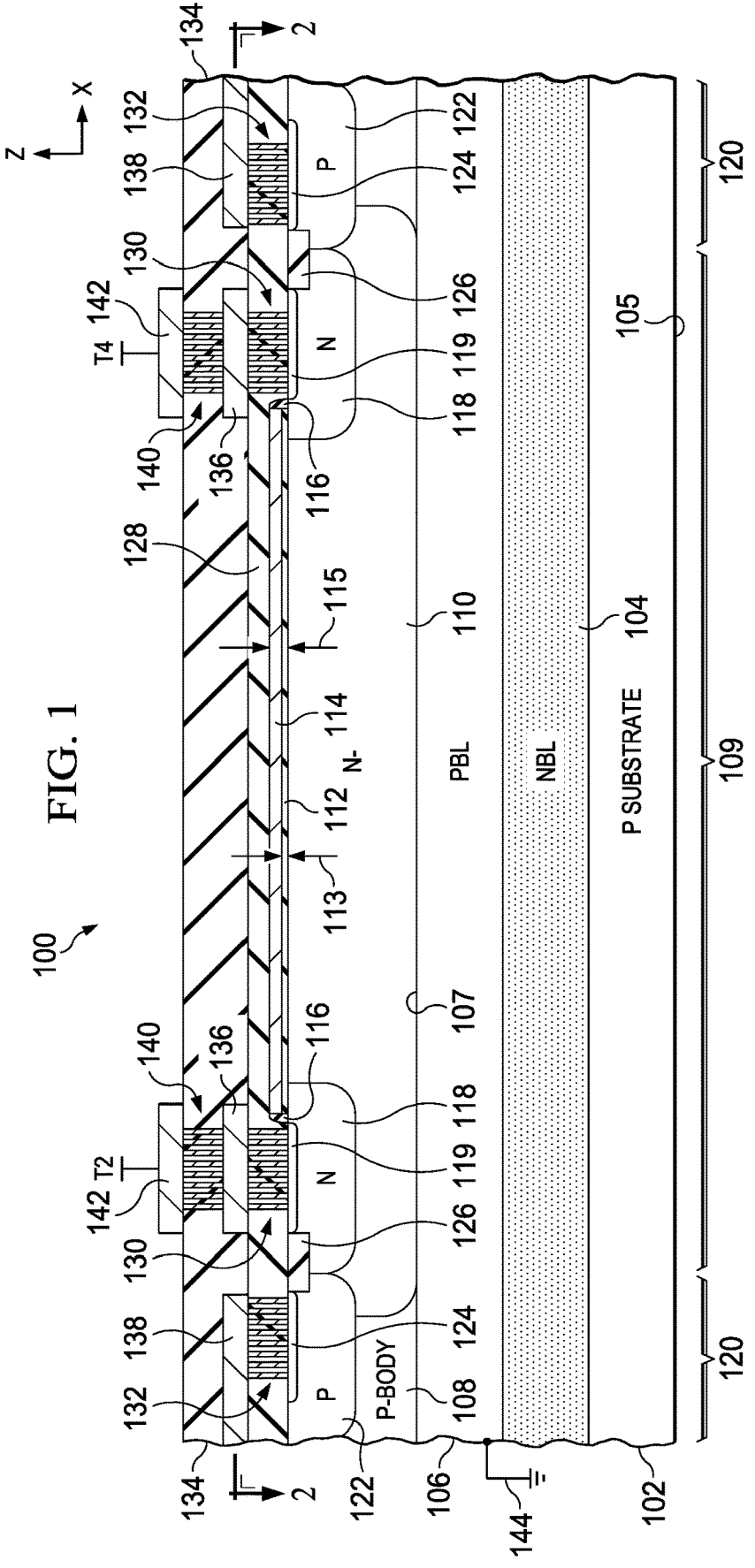
FIG. 1 is a partial sectional side elevation view of an integrated circuit semiconductor device that includes a Hall sensor with an n-doped Hall well or implanted region, n-doped access regions or doped regions, and a doped polysilicon control terminal taken along line 1-1 of FIG. 2.

In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to . . . " Also, the term "couple" or "couples" is intended to include indirect or direct electrical or mechanical connection or combinations thereof. For example, if a first device couples to or is coupled with a second device, that connection may be through a direct electrical connection, or through an indirect electrical connection via one or more intervening devices and connections. The various features of the disclosed examples can be used in connection with a variety of different semiconductor devices, including without limitation integrated circuits having multiple electronic components, as well as single component semiconductor devices (e.g., single transistor products, single diode products, etc.).

Hall sensors, semiconductor devices and methods are described herein that may facilitate tailoring or adjusting performance characteristics of Hall sensors. Disclosed examples can be advantageously employed to tailor sensitivity, resistance, offset, noise, bandwidth and/or other magnetic sensor attributes to accommodate particular desired operating conditions, as well as to adjust for temperature, stress and/or other environmental conditions. While such examples may be expected to provide various benefits in such applications, no particular result is a requirement of any example unless explicitly recited in a particular claim. In certain examples, a Hall sensor includes a Hall well (sometimes referred to herein as an implanted region) and access regions (sometimes referred to herein as doped portions) of the same dopant conductivity type (e.g., N or P). In certain examples, all or a portion of the implanted region is capped with a gate oxide (sometimes referred to herein as a dielectric layer) and a gate electrode (sometimes referred to herein as an electrode layer). The electrode layer in certain examples includes a polysilicon layer, which can be doped with either P or N type dopants. The electrode layer in certain examples is used as an additional biasing terminal to programmatically set or dynamically modulate or adjust the performance of the Hall sensor. In certain examples, the Hall sensor includes four doped portions, including a first pair to receive a Hall sensor bias voltage or current signal, and a second pair to provide a Hall voltage sensor signal that represents a sensed magnetic field applied to the sensor. The sensor may include a fifth terminal connected to the electrode layer to receive a second bias signal, such as a control signal, to set and/or adjust one or more performance parameters of the Hall sensor.

Certain examples utilize thin oxide layers for the gate dielectric to facilitate controlled modulation of the electrostatic behavior of the Hall well, which is not feasible for some Hall wells capped with local oxidation of silicon (LOCOS) or shallow trench isolation (STI) structures, as these are too thick to be useful as "gates" modulating the performance of the Hall well. In addition, LOCOS or STI-capped interfaces are not as clean as MOSFET oxides, resulting in higher noise. Disclosed examples also provide advantages compared with P-N junction capped Hall wells, including enhanced control range or adjustability regarding magnetic sensitivity, resistance, offset, noise and/or bandwidth compared with junction gate approaches that only provide a small degree of performance modulation through reverse biasing. A junction capped element acts like a JFET, and accordingly provides only limited dynamic variability with gate modulation. Moreover, described examples differ from magnetic field effect transistors (MAGFETs) in which the source and drain regions are doped with opposite conductivity type dopants as the channel, and which suffer from high noise due to operation with the channel inverted. In addition, magnetic FET devices detect differences in currents through two drains, whereas the disclosed examples detect the Hall voltage. The disclosed examples facilitate modulation of a Hall sensor, for example, through dynamic modulation by circuitry within the semiconductor device, or by application of an external control signal. In other examples, the control or modulation signal applied to the electrode layer can be programmed, such as by fuses, trim circuits, or other means during manufacturing, to facilitate manufacturing of magnetic sensors of different ranges for sensitivity, noise immunity, etc. Disclosed examples facilitate setting or adjusting the Hall well to various degrees of depletion or accumulation by applying a voltage bias to the electrode layer. Disclosed examples provide control of one or more Hall element characteristics, which can be set during manufacturing based on product performance needs, or during use based on sensed environmental operating conditions, external signals, etc. In other possible implementations, the electrode voltage can be applied in a closed loop fashion to implement automatic gain control (AGC) in a magnetic sensing application.

Figure 2:
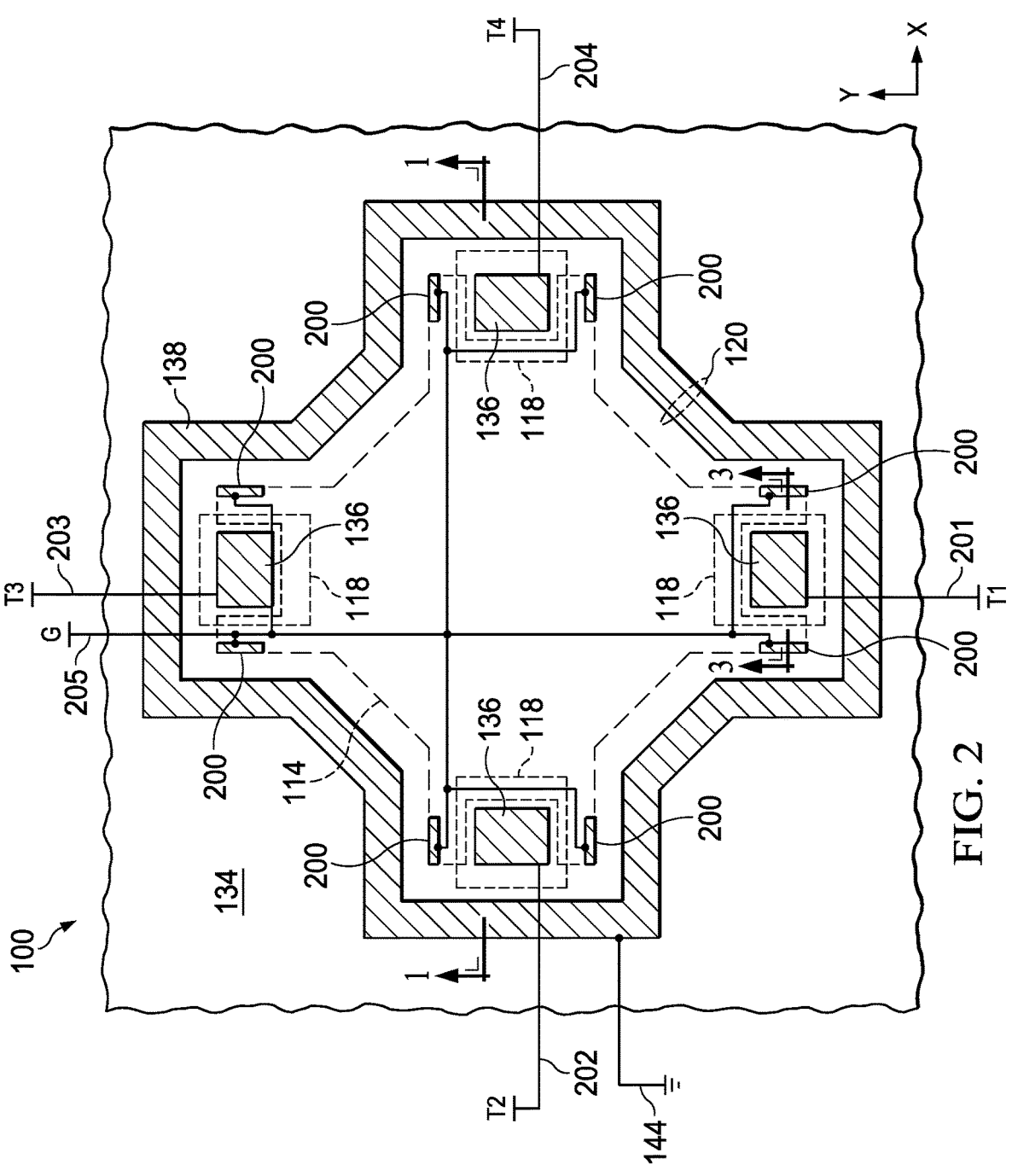
FIG. 2 is a top plan view of a portion of the semiconductor device taken along line 2-2 of FIG. 1.
Figure 3:
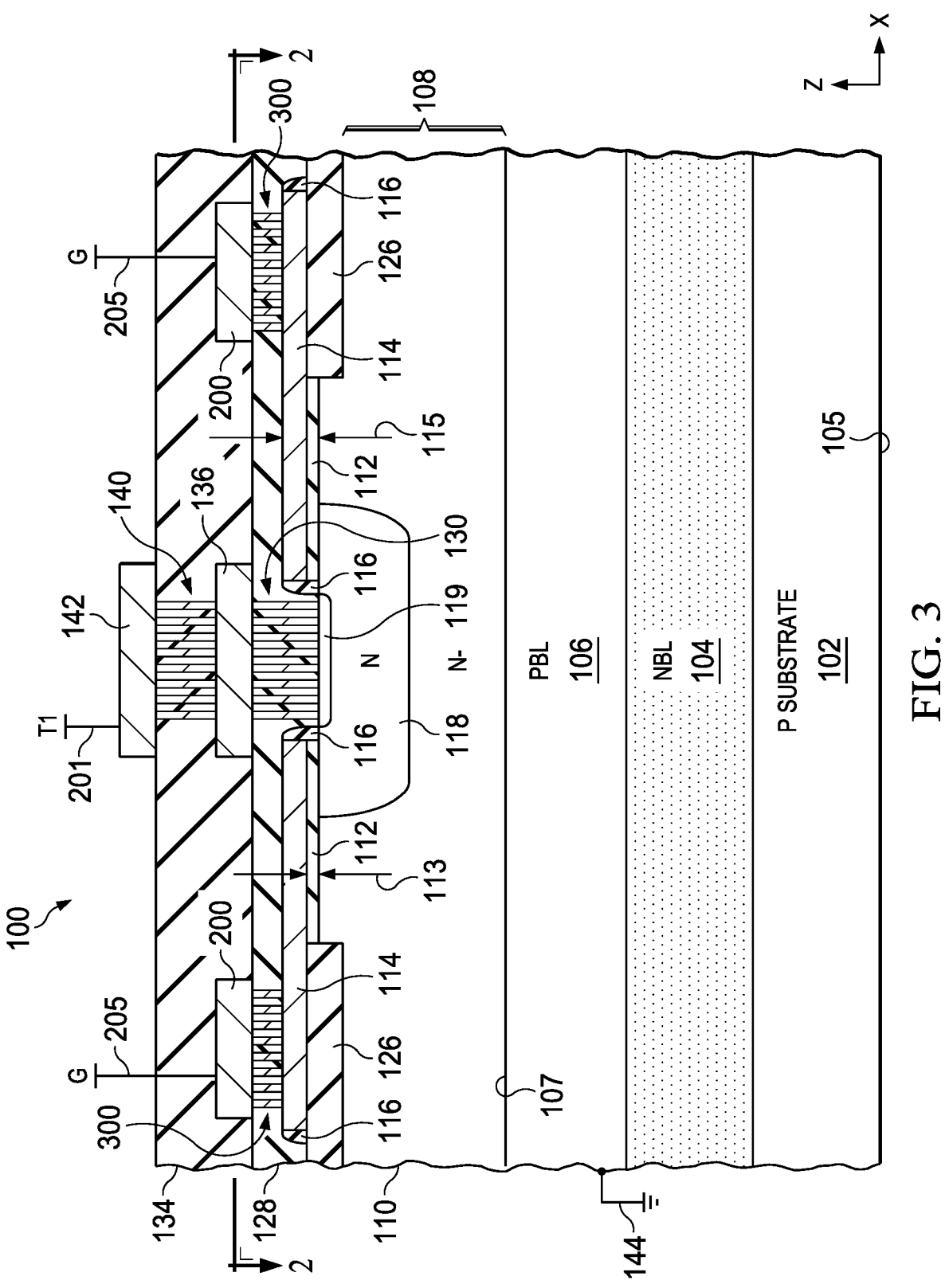
FIG. 3 is a partial sectional end elevation view of the semiconductor device taken along line 3-3 of FIG. 2.

Referring initially to FIGS. 1-3, FIG. 1 is a partial sectional side view of an example integrated circuit semiconductor device 100 that includes a Hall sensor with an n-doped Hall well or implanted region, n-doped access regions or doped regions, and a doped polysilicon control terminal taken along line 1-1 of FIG. 2. FIG. 2 shows a sectional top view of a portion of the semiconductor device 100 taken along line 2-2 of FIG. 1, and FIG. 3 is a partial sectional end view showing details of the control terminal of the semiconductor device 100 taken along line 3-3 of FIG. 2. The semiconductor device 100 in one example is an integrated circuit (IC) that includes multiple electronic components, including the illustrated Hall sensor and one or more additional components. The various features of the disclosed examples can be used in connection with a variety of different semiconductor devices, including without limitation integrated circuits having multiple electronic components, as well as single component semiconductor devices (e.g., single Hall sensor products).

As shown in FIG. 1, the semiconductor device 100 includes a semiconductor structure with a semiconductor substrate 102. The semiconductor substrate 102 in one example is a silicon wafer, a silicon-on-insulator (SOI) substrate or other semiconductor structure. In one example, the substrate 102 is a p-doped silicon substrate or wafer with a top side, various buried layers 104, 106 formed therein, and a bottom side 105. In another possible implementation, the substrate 102 includes one or more epitaxial silicon layers (not shown) formed on a top surface, with one or more of the buried layers 104, 106 formed in epitaxial layers of the substrate. The example semiconductor structure includes a first doped layer 106 that includes p-type majority carrier dopants. In one implementation, the p-type layer includes a portion implanted with boron to form a p-type buried layer (PBL) with an upper or top side 107. The example layer 104 (e.g., an n-type buried layer or NBL) includes n-type majority carrier dopants. In the illustrated example, the semiconductor structure includes the substrate 102, the buried layers 104 and 106, and an upper semiconductor surface layer 108 (e.g., a p-doped body region).

The NBL 104 extends along the vertical −Z direction from beneath the PBL 106 toward the second side 105. In one example, a first epitaxial silicon layer is formed over the upper surface of a silicon wafer substrate 102, and all or a portion of the first epitaxial layer is implanted with n-type dopants (e.g., phosphorus, etc.) to form the NBL 104. In this example, a second epitaxial silicon layer is formed over the first epitaxial layer, and all or a portion of the second epitaxial layer is implanted with p-type dopants (e.g., boron, etc.) to form the p-type buried layer 106 with the upper side 107. In one example, the PBL region 106 is formed using ion implantation through the first EPI surface. The semiconductor surface layer 108 extends over (e.g., directly on) the p-type buried layer 106 and includes the upper side of the semiconductor structure.

The semiconductor device 100 includes a Hall type magnetic sensor formed in an active region 109 of the device 100

(designated in FIG. 1). The Hall sensor includes a Hall well (sometimes referred to as an implanted region) 110 in the surface layer 108. The semiconductor surface layer 108 in this example includes majority carrier dopants of a first conductivity type (P), and the implanted region 110 includes majority carrier dopants of a second conductivity type (N), although not a requirement of all possible implementations. The example surface layer 108 has p-type majority carrier dopants and extends downward along the −Z direction from the top side of the semiconductor structure.

The Hall sensor also includes access terminals to provide electrical connection to doped regions of the implanted region 110. The illustrated example includes a first terminal (schematically labeled T1 in FIGS. 2 and 3), a second terminal (schematically labeled T2 in FIGS. 1 and 2), a third terminal (schematically labeled T3 in FIG. 2), and a fourth terminal (schematically labeled T4 in FIGS. 1 and 2). Each of the terminals T1-T4 is electrically connected to a respective doped region in the implanted region 110. In operation in one example, a first bias signal, such as a voltage or a current, is provided to a first pair (e.g., T1 and T3) of the terminals to bias the Hall well formed by the implanted region 110. A second pair (e.g., T2 and T4) of the terminals is used to sense a Hall voltage that represents an incident magnetic field detected by the sensor. In one example, the Hall sensor can be used in combination with circuitry (not shown) that electrically rotates the bias and sense terminals to mitigate offset (e.g., spinning-and-chopping circuitry), for example, using 2 or 4 phase rotation. As shown in FIG. 2, the example Hall sensor is a symmetrical cross structure with chamfered corners, in which first and second pairs of terminals are oppositely disposed from one another, and the pairs are angularly offset from one another by 90°, although not a requirement of all possible implementations. In addition, while the example Hall sensor includes four terminals, additional terminals can be provided, for example, in a symmetrical or asymmetrical 8 or 12 terminal arrangement (not shown).

In addition to the four or more Hall sensor access terminals T1-T4, the semiconductor device 100 further includes a control terminal to facilitate application of a bias voltage to all or a portion of the implanted region 110. The illustrated example includes a dielectric layer 112 with a thickness 113 over the implanted region 110 and a conductive electrode layer 114 with a thickness 115 over the dielectric layer 112. In one example, the dielectric layer 112 has a non-zero thickness 113 of 1200 Å (120 nm) or less. In another example, the thickness 113 of the dielectric layer 112 is 20 Å (2 nm) or more. In another example, the thickness 113 of the dielectric layer 112 is 20 Å (2 nm) or more and 200 Å (20 nm) or less. In one example, the dielectric layer 112 is in contact with (i.e., directly on) the implanted region 110, and the electrode layer 114 is in contact with (i.e., directly on) the dielectric layer 112, although such direct contact is not a requirement of all possible implementations. In this regard, one or more intervening layers (not shown) may be disposed between the top side of the implanted region 110 and the dielectric layer 112 and/or between the top side of the dielectric layer 112 and the bottom side of the electrode layer 114.

In one example, the electrode layer 114 includes doped polysilicon. In one such example, the doped polysilicon electrode layer 114 includes majority carriers of the first conductivity type (P, e.g., boron). In another example, the doped polysilicon electrode layer 114 includes N type majority carriers (e.g., phosphorus). As further shown in FIGS. 1 and 3, the semiconductor device 100 also includes sidewall spacers 116 formed along the lateral sidewalls of the electrode layers 114. In another example, the sidewall spacers 116 can be omitted. In practice, the dielectric thickness 113 and/or the doping concentration and profile of the electrode layer 114 can be tailored for a given application to facilitate application of a suitable bias voltage to the underlying implanted region 110 to achieve a desired amount of enhancement or depletion thereof, for a given applied signal voltage amplitude. The effectiveness of the electrode layer (e.g., polysilicon gate) 114 to modulate the implanted region 110 (e.g., the Hall well) can be tailored for a given device by adjusting the dielectric thickness 113, the electrode layer doping, and the doping of the implanted region 110. For example, a very low doping profile for the implanted region 110 can be used in combination with a relatively thick dielectric layer 112, and conversely a higher implanted region doping could be used in combination with a thinner dielectric layer 112.

The terminals T1-T4 in the semiconductor device 100 also include respective first, second, third, and fourth doped regions 118, 119. In another example, one or both of the doped regions 118 and/or 119 can be omitted. In the example of FIGS. 1-3, the implanted region 110 is a lightly doped implanted portion of the semiconductor surface layer 108, and is accordingly labeled N− in FIGS. 1 and 3. The respective doped regions also include a medium doped portion 118 (labeled N), and a heavily doped surface portion 119 (e.g., N+). The heavy doping of the portions 119 facilitates low impedance electrical connection to upper conductive features of the associated sensor terminal. The doped regions 118, 119 are spaced apart from one another in the implanted region 110. In the illustrated example, the implanted region 110 and the doped regions 118, 119 include majority carriers of the same conductivity type (e.g., N in the example of FIGS. 1-3). As discussed further below in connection with FIGS. 12-14, the doped regions and the implanted region can alternatively be doped with p-type majority carrier dopants.

As shown in FIGS. 1 and 2, the example Hall sensor is laterally surrounded by an isolation structure 120 that extends around the implanted region 110. The isolation structure 120 in this example includes doped regions 122 that include p-type majority carrier dopants. In this example, moreover, the doped regions 122 have a medium dopant concentration, and are accordingly labeled P. The illustrated example also includes heavily doped p-type implanted regions 124 (e.g., P+) to facilitate low impedance electrical connection to the isolation structure 120. In alternative examples, a trench-based isolation structure can be used (not shown), such as a deep trench isolation structure. The illustrated semiconductor device 100 also includes surface isolation features 126, such as shallow trench isolation (STI) material. In another possible implementation, the surface isolation features can be local oxidation of silicon (LOCOS) structures, or other suitable electrically isolating features.

The example semiconductor device 100 also includes a metallization structure, a first dielectric structure layer 128 formed over the semiconductor structure, and a single or multi-level upper metallization structure. In one example, the first dielectric 128 structure layer is a pre-metal dielectric (PMD) layer disposed over the electrode layer 114 and the sidewall spacers 116, and over the upper surface of the surface layer 108 of the semiconductor structure. In one example, the first dielectric structure layer 128 includes silicon dioxide ($SiO_2$) although other suitable dielectric materials can be used in other examples. The PMD layer 128 includes contacts 130 and 132 (e.g., tungsten) that respectively provide direct electrical connection (e.g., direct contact or connection through a silicide layer such as CoSi$_2$, not shown) to one or more features of the N+ heavily doped access terminal portions 119, and the P+ heavily doped implanted region 124. The upper metallization structure can include one or more further metallization layers. In the illustrated example, the upper metallization structure includes a first (e.g., top) metallization layer 134 that extends over the PMD layer 128. The upper metallization layer 134 includes conductive metal routing features or lines 136 connected to the tungsten contacts 130 associated with the Hall sensor terminals, as well as conductive metal routing features or lines 138 connected to the contacts 132 of the isolation structures 120. The upper metallization layer 134 also includes conductive vias 140 that contact the conductive metal routing lines 136, and upper conductive contacts 142 electrically contact the vias 140 to provide external access to the Hall sensor terminals. The device 100 in FIGS. 1-3 is shown as a wafer prior to singulation and packaging, but the illustrated structure represents the described features after separated as a die for packaging. In one example, the isolation structure 120 includes a metal line 138 that extends around the lateral periphery of the sensor, and the underlying p-type buried layer 106 provides a ground reference connection 144 schematically shown in FIGS. 1 and 3.

The upper metallization layer 134 is referred to hereinafter as an interlayer or interlevel dielectric (ILD) layer. Different numbers of layers can be used in different implementations. In one example, the ILD layer 134 and the PMD layer 128 are formed of silicon dioxide (SiO$_2$) or other suitable dielectric material. In certain implementations, the individual layers of a single or multi-layer upper metallization structure can be formed in two stages, including an intra-metal dielectric (IMD, not explicitly shown) sub layer with conductive metal routing features or lines (e.g., aluminum, copper, etc.), and an ILD sublayer overlying the IMD sub layer with conductive contacts or plugs (e.g., tungsten vias). The individual IMD and ILD sublayers can be formed of any suitable dielectric material or materials, such as SiO$_2$-based dielectric materials. The first layer and any subsequent layer(s) in the upper metallization structure include conductive metallization interconnect structures, referred to as lines, formed on the top surface of the underlying layer. In this example, the first layer and the subsequent ILD layers also include conductive vias, such as tungsten or aluminum that provide electrical connection from the metallization features of an individual layer to an overlying metallization layer. The individual layers can be constructed using any suitable metallization fabrication processing, such as single damascene or dual damascene processes.

FIG. 2 shows a top view of a portion of the device 100. In the illustrated example, the isolation structure 120 extends around the lateral periphery of the active region 110, and also extends around three sides of a capacitor region. The top view of FIG. 2 is a section view through the ILD layer 134 and the metal lines 136, 138 along line 2-2 of FIG. 1. The example configuration is a symmetrical cross shape with chamfered interior corners, although many other symmetrical or asymmetrical configurations can be used. In various examples, a line between the terminals T1 and T3 is about orthogonal to a line between the terminals T2 and T4. In various examples, the distance between the terminals T1 and T3 is about equal to the distance between the terminals T2 and T4. In such implementations, the terminals T1 . . . T4 are located at corners of a square. In one alternate example, the distance between the terminals T1 and T3 is different than the distance between the terminals T2 and T4. In such implementations, the terminals T1 . . . T4 are located at corners of a rhombus. As previously mentioned, more than four terminals can be provided in other examples. In this example, a single isolation region conductive metal line 138 extends around the periphery of the active region 109 of the Hall sensor and provides a ground reference connection 144. FIG. 2 further illustrates conductive metal line features 200 formed in the upper metallization ILD layer 134 that connect with gate control terminals of the Hall sensor. The electrode layer 114 (e.g., polysilicon) includes finger portions that extend around three sides of the doped portions 118, and the conductive metal line features 200 are formed over portions of the electrode layer 114.

As schematically shown in FIG. 2, the example Hall sensor includes a first pair of terminals T1 and T3, respectively shown as schematic connection lines 201 and 203, as well as a second pair of terminals T2 and T4, respectively shown as schematic connection lines 202 and 204. The example Hall sensor includes a fifth terminal (labeled G in FIGS. 2 and 3, that are electrically connected together in the metallization structure to form a gate control connection shown as a schematic connection line 205 in FIGS. 2 and 3.

FIG. 3 further illustrates one access portion of the Hall sensor, taken along line 3-3 of FIG. 2. The gate control terminal portions include tungsten contacts 300 formed through the PMD layer 128 to provide electrical contact to the top side of portions of the electrode layer 114 (e.g., doped polysilicon). The tungsten contacts 300 extend through the PMD layer 128 from the electrode layer 114 to the conductive metal line features 200 to form the gate control connection.

Figure 4:
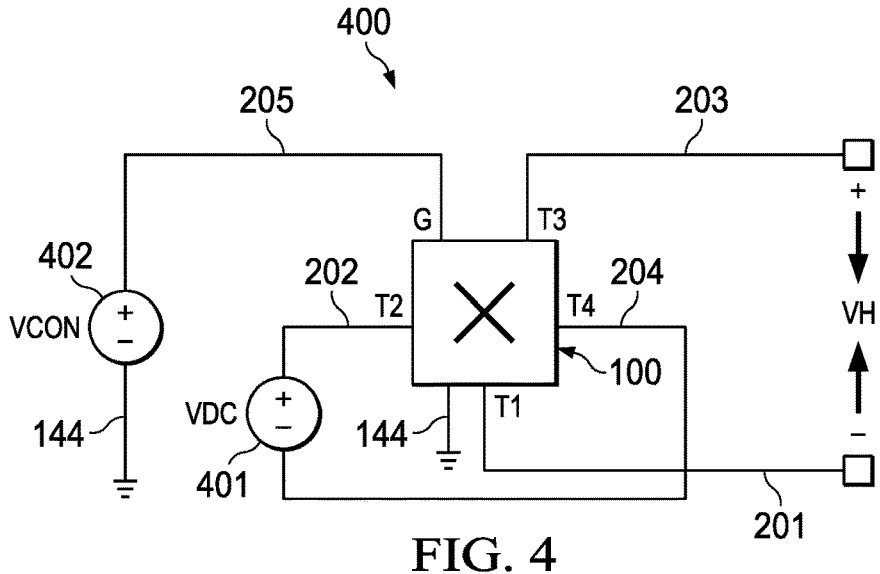
FIG. 4 is a partial schematic diagram of a Hall Sensor with a bias supply connected to a first pair of Hall terminals and a control voltage supply connected to a control terminal of the sensor.

FIG. 4 shows an example Hall sensor circuit 400 that includes the example semiconductor device 100 having connections 144 and 201-205 as discussed above in connection with FIGS. 1-3. The circuitry 400 of FIG. 4 in one example is provided in a single semiconductor device 100, for example, including supply circuitry 401 and 402 along with the Hall sensor described above. In another example, one or both of the supply circuit 401 and/or 402 can be separate circuits. For example, a single integrated circuit semiconductor device can include the Hall sensor (designated 100 in FIG. 4) along with an internal first supply circuit 401 to provide a first bias signal to a first pair of the terminals T1-T4 (e.g., T2 and T4 in the example of FIG. 4), and the IC can include terminals to provide external access for receiving a resulting Hall voltage signal VH from the second pair of sensor terminals T1 and T3, as well as a further terminal to receive a control voltage signal VCON from an external second supply circuit 402. This example allows an end user to provide the control voltage to the sensor IC in order to set or adjust one or more operating parameters of the Hall sensor (e.g., the magnetic sensitivity, resistance, offset, noise and/or bandwidth). In one possible implementation, a user circuit board (not shown) can include one or more environmental sensors (e.g., a thermocouple, RTD, or other temperature sensor, a humidity sensor, etc.), along with closed-loop control circuitry that operates the second supply circuit 402 in order to provide a control voltage signal VCON to adjust the performance of the Hall sensor based on a sensed operating condition.

In another example, the second supply circuit 402 is included in the sensor IC, and the value of the supplied control voltage signal VCON is set by fuses or other programmable circuitry during manufacturing. In another example, the second supply circuit 402 is included in the sensor IC, and the value of the supplied control voltage signal VCON is field programmable.

In another example, the sensor IC includes the second supply circuit 402 as well as an internal sensor (e.g., a temperature sensor), and closed-loop circuitry is included in the sensor IC to selectively adjust the control voltage signal VCON to compensate for temperature changes of the IC during operation.

In another example, the IC or user circuit board includes dynamic adjustment circuitry to adjust the control voltage signal VCON for automatic gain control to selectively modify the magnetic sensitivity and/or noise rejection of the Hall sensor to accommodate a variety of magnetic field sensing conditions during operation.

In another example, the IC or user circuit board includes an analog-to-digital (A/D) converter and other processing circuitry (not shown) to derive or otherwise obtain a magnetic field strength value based on the sensed Hall voltage signal VH across the second pair of terminals T1 and T3.

In the illustrated example, the first supply circuit 401 is connected to provide a non-zero first bias signal VDC to the first pair 202, 204 of the terminals (T2 and T4), and the second supply circuit 402 is connected to provide a non-zero second bias signal VCON to the electrode layer 114 via the fifth terminal G.

Referring now to FIGS. 5-11, FIG. 5 shows an example method 500 of fabricating a semiconductor device, such as an integrated circuit or standalone device. The example method 500 is illustrated and described below in connection with fabrication of the illustrated semiconductor device 100 of FIGS. 1-3, where FIGS. 6-11 show the semiconductor device 100 at various stages of fabrication according to the method 500. The method 500 begins at 502 with an n-type implantation to form an n-doped region, such as the NBL region 104 in FIG. 6. In one example, a first epitaxial silicon layer is formed over the upper surface of a silicon wafer substrate 102, and all or a portion of the first epitaxial layer is implanted with n-type dopants (e.g., phosphorus, Sb, etc.) at 502 to form the NBL 104.

Figure 6:
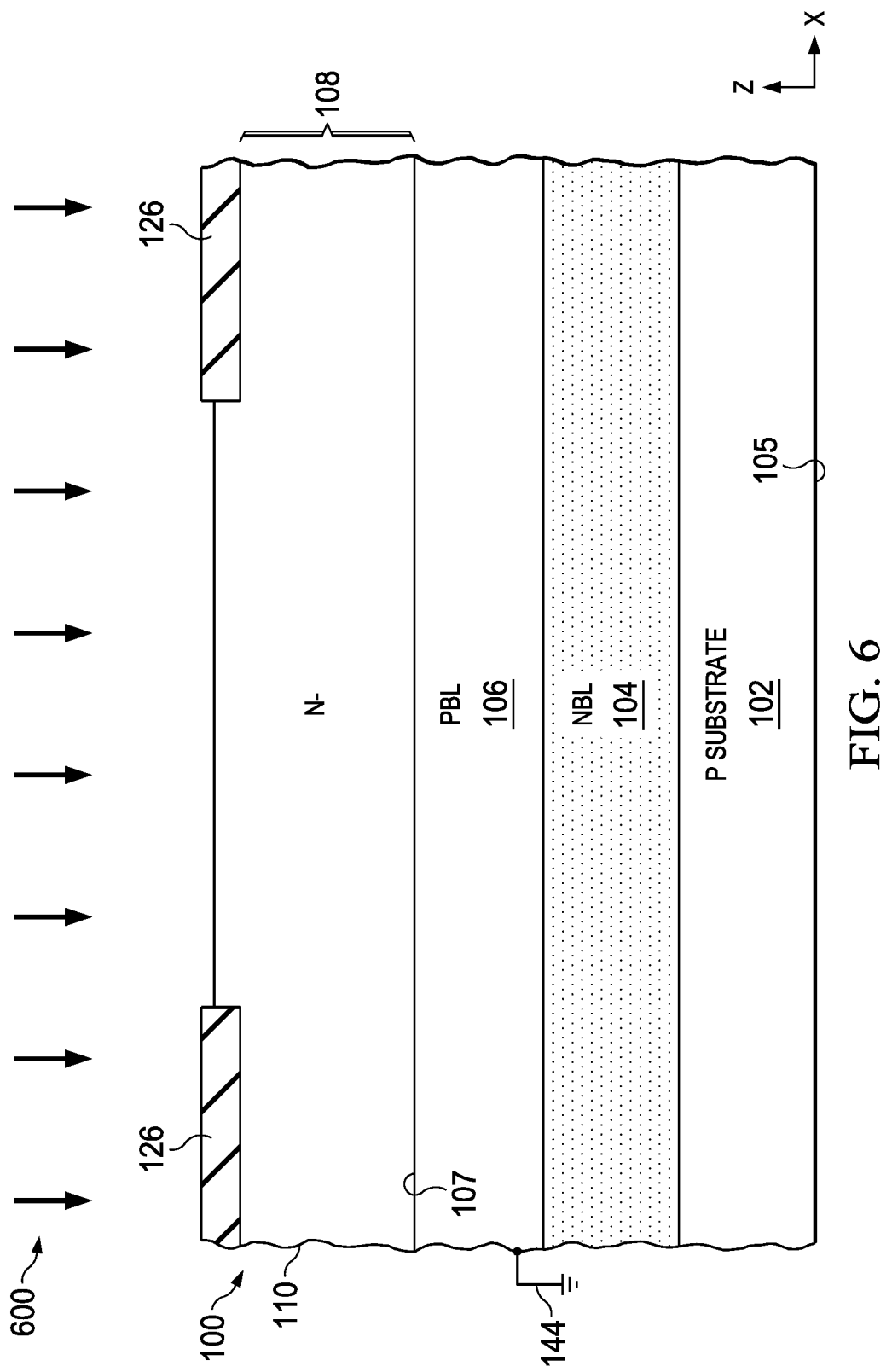
FIGS. 6-11 are partial sectional side elevation views of the semiconductor device of FIGS. 1-3 undergoing fabrication according to the method of FIG. 5.

In one example, a p-type buried layer is implanted at 503. In one example, all or a portion of the first epitaxial layer is implanted at 503 with p-type dopants (e.g., boron, etc.) to form the p-type buried layer 106 with the upper side 107 as shown in FIG. 6. In one example, the PBL region 106 is formed using ion implantation through the final silicon surface (e.g., the top of the second epitaxial layer), with a depth set by using a high implantation energy. In one example, a further epitaxial silicon deposition process is performed at 504, which deposits a second epitaxial silicon layer over the first epitaxial layer. In one example, a p-body implant is performed to implant boron or other p-type dopants to form p-body regions 108 in the prospective Hall sensor region of the device 100, as well as in other regions of the device 100 if other transistors, such as drain extended MOS transistors (not shown) are to be included. In one example, the semiconductor surface layer 108 (e.g., labeled P-BODY in FIG. 1 above) is implanted with p-type majority carrier dopants (e.g., boron) and extends downward along the −Z direction from the first side 103 to the upper side 107 of the PBL 106.

Figure 5:
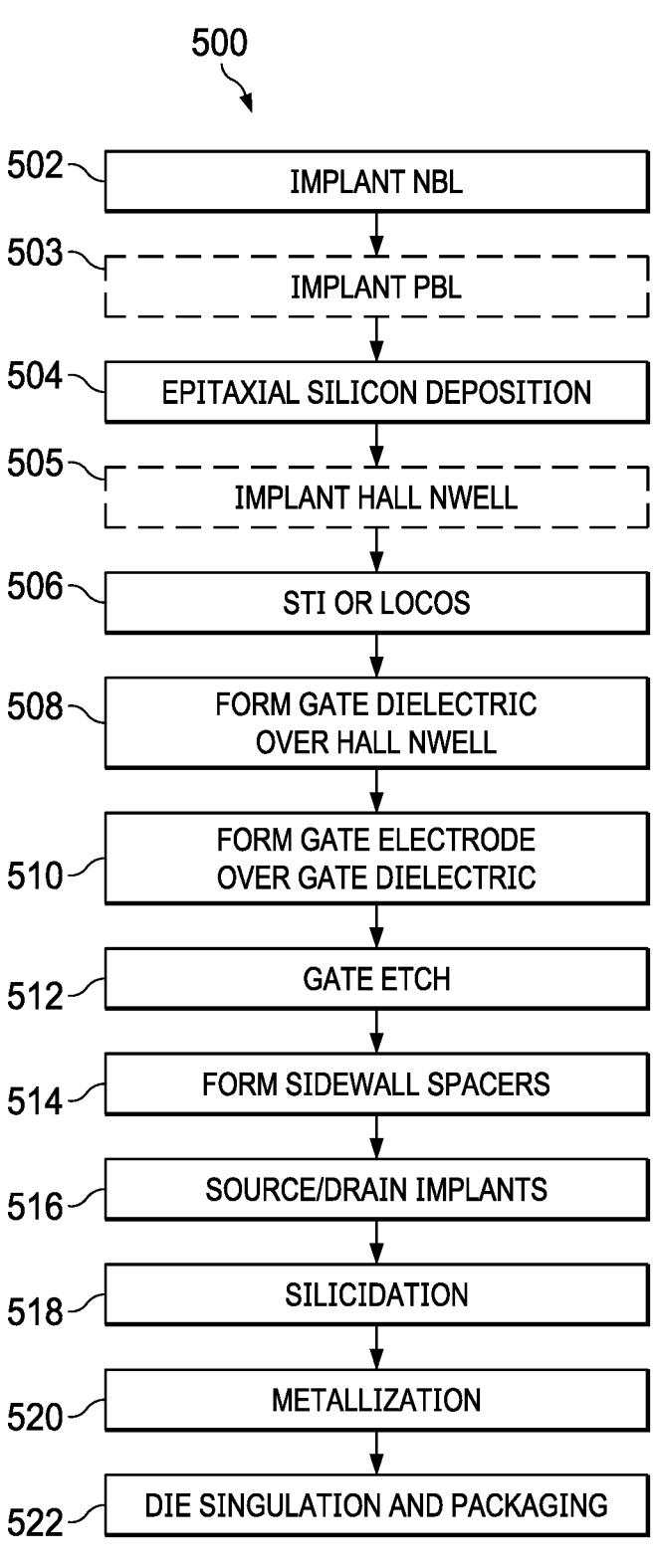
FIG. 5 is a flow diagram of a method of fabricating a semiconductor device with a controllable Hall magnetic sensor.

At 505 in FIG. 5, a Hall well is implanted. In one example, a first implantation process is performed at 505 with a mask (not shown) that implants phosphorus or other n-type dopants to form the implanted region 110 in the semiconductor surface layer 108. In one example, the implanted region 110 extends laterally in the active region 109 of the p-type body region 108 within the surrounding isolation region 120 as shown in FIG. 1. In one example, the implantation is a low dose implant with a patterned mask (not shown) that forms the implanted region 110 and concurrently forms one or more high voltage n wells elsewhere in the surface layer 108 for high voltage transistors in an integrated circuit (IC) device implementation.

The method 500 also includes shallow trench isolation (STI) processing at 506. FIG. 6 shows one example, in which an STI fabrication process 600 is performed that etches trenches and fills the trenches with an oxide material 126. In one example, the STI processing includes growing a pad oxide, depositing a nitride layer (not shown) using low-pressure chemical vapor deposition (LPCVD), patterning and etching trenches in the silicon of the surface layer 108 and in the liner and silicon of the trenches. The STI processing also includes growing a liner oxide in the STI trenches to repair silicon and round off sharp corners, followed by plasma enhanced CVD (PECVD) deposition of TEOS oxide. The processing further includes another chemical mechanical polishing of the trench oxide using the nitride as an etch stop, followed by removal of the nitride etch stop layer (not shown). In another example, LOCOS can be used instead of STI.

The method 500 in FIG. 5 also includes transistor fabrication type processing at 508-516 in FIG. 5, which is used in one example to concurrently fabricate the polysilicon-capped Hall sensor in the device 100 of FIGS. 1-3 while fabricating one or more PMOS and/or NMOS transistors in an integrated circuit implementation. Accordingly, in certain examples, the processing at 508-516, such as the gate oxide (dielectric layer) thickness 113 and the polysilicon gate (electrode layer) thickness 115 and doping) are tailored to transistor design criteria, and the provision of a control gate structure allows tuning of the Hall sensor performance during manufacturing and/or in use in an end user circuit board.

Figure 7:
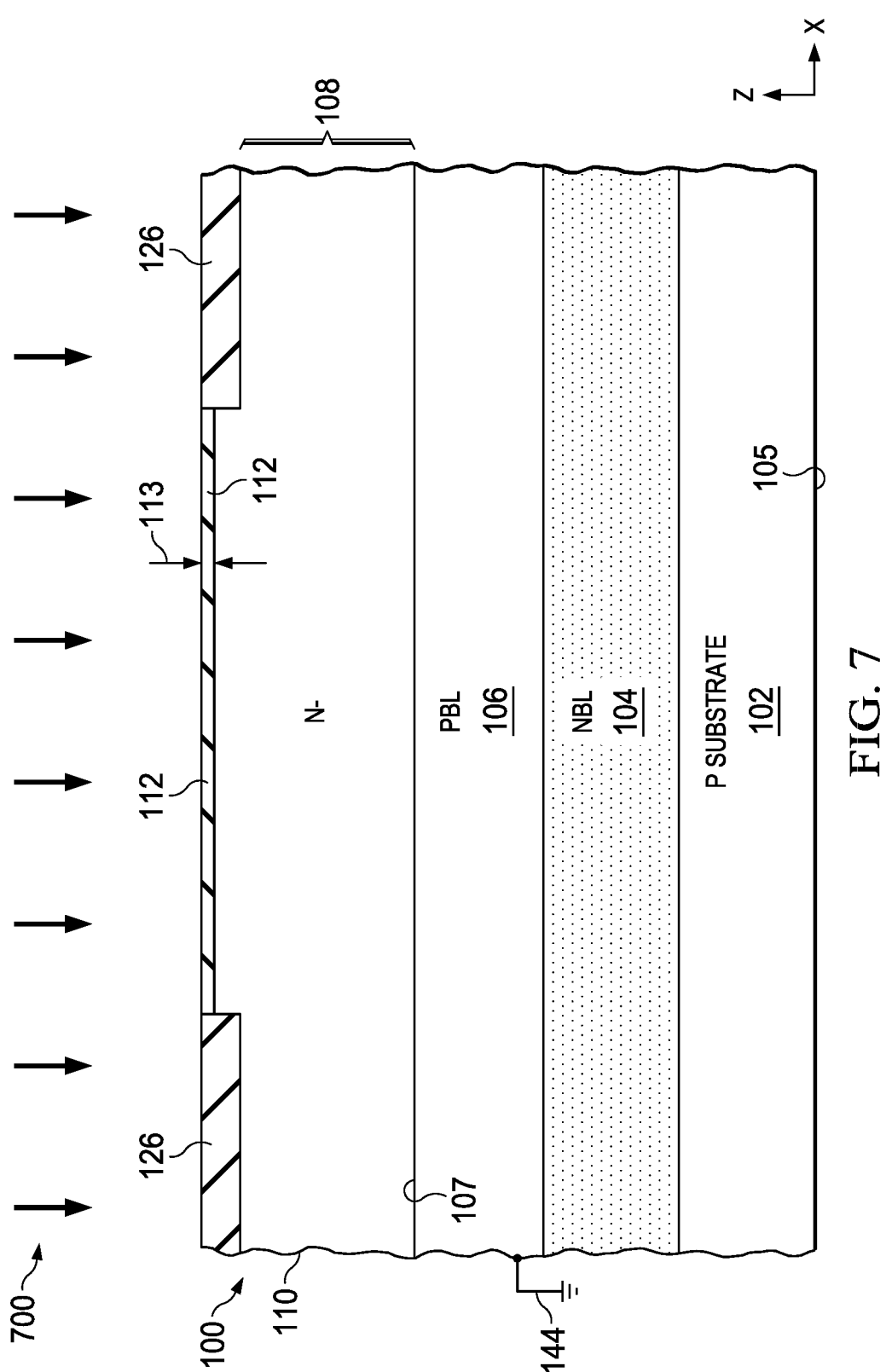

At 508, a gate dielectric layer is formed over the Hall well implanted region 110. FIG. 7 shows one example, in which an oxidation process 700 is performed that forms an oxide dielectric layer 112 to the thickness 113 directly over the implanted region 110 between the illustrated STI structures 126. In one example, a silicon oxynitride (SiON) gate dielectric layer 112 is concurrently formed on the implanted region 110 of the prospective Hall sensor and also in prospective transistor regions (not shown) of an IC implementation.

Figure 8:
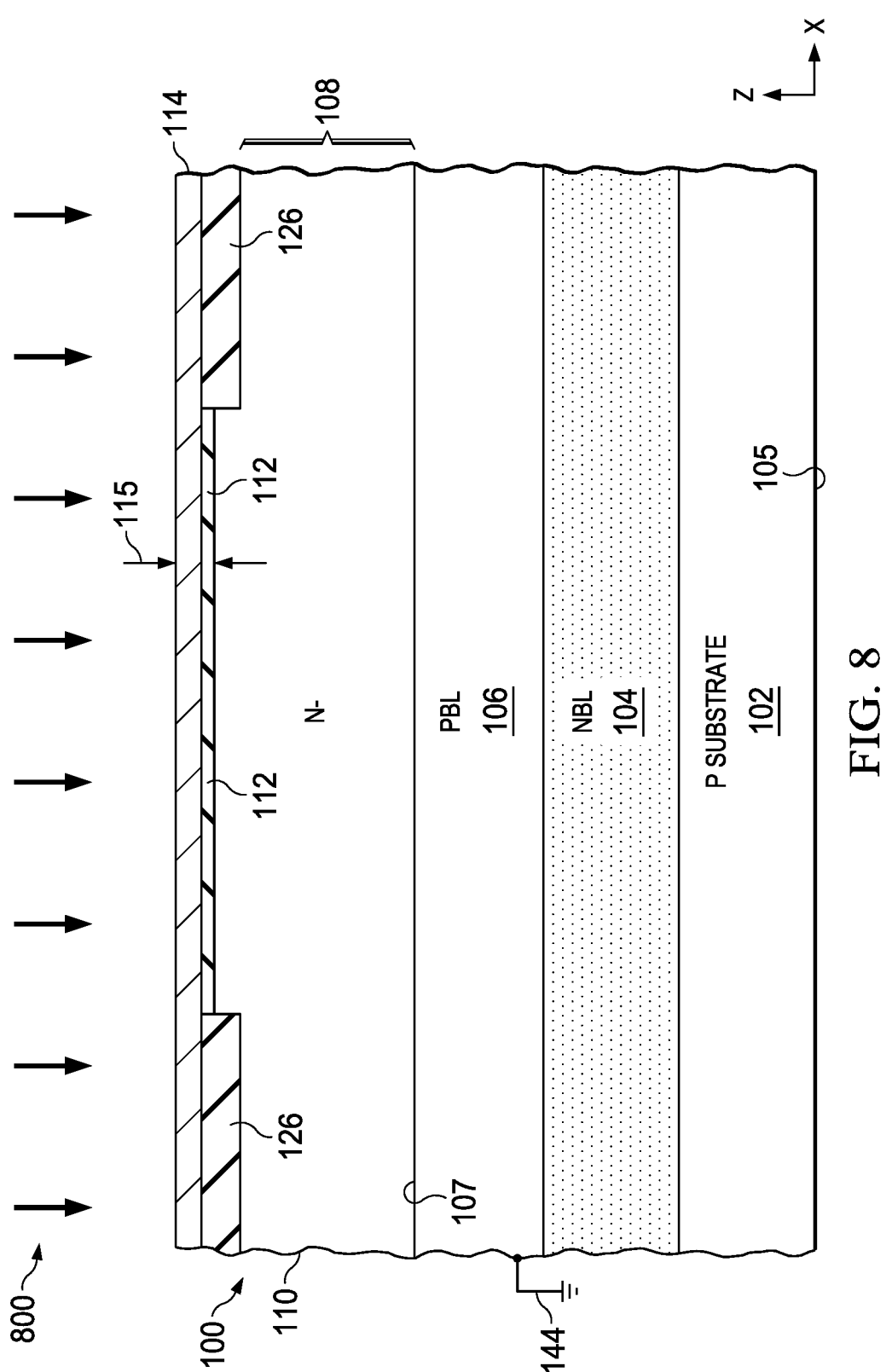

The method 500 in FIG. 5 also includes gate fabrication at 510 and 512 that forms the electrode layer 114 over the dielectric layer 112. At 510, one or more gate electrode material layers are formed above the gate dielectric layer 112. The gate electrode layer(s) 114 may be formed to any suitable thicknesses 115 using any suitable electrode material(s) and deposition process(es). FIG. 8 shows one example, in which a deposition process 800 is performed that deposits the polysilicon electrode layer 114 to the thickness 115 (e.g., about 1600 Å, or 160 nm). The polysilicon can be doped with either n or p-type dopants in different examples. The dopant concentration can be tuned according to desired transistor operation for IC implementations.

Figure 9:
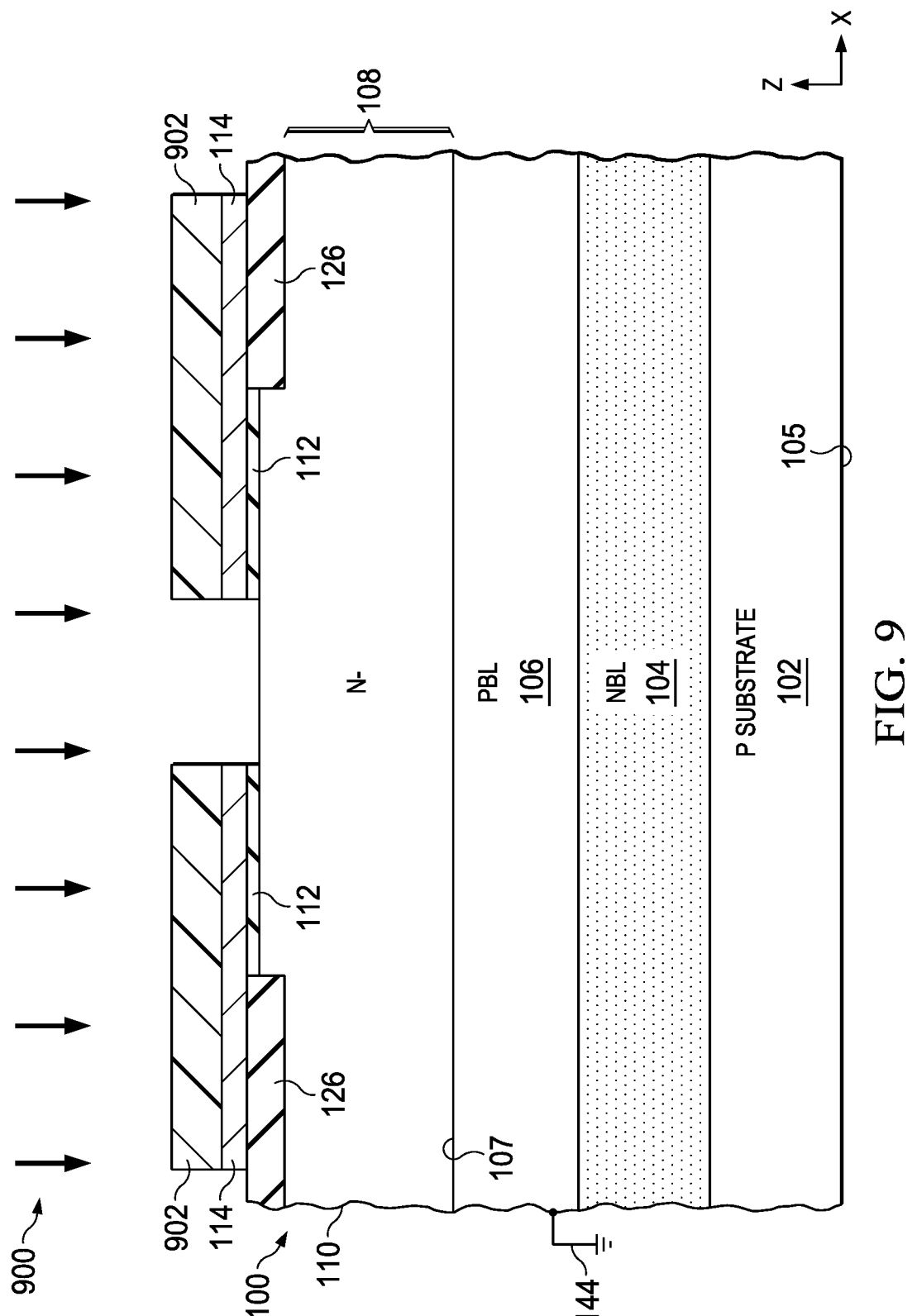
Figure 10:
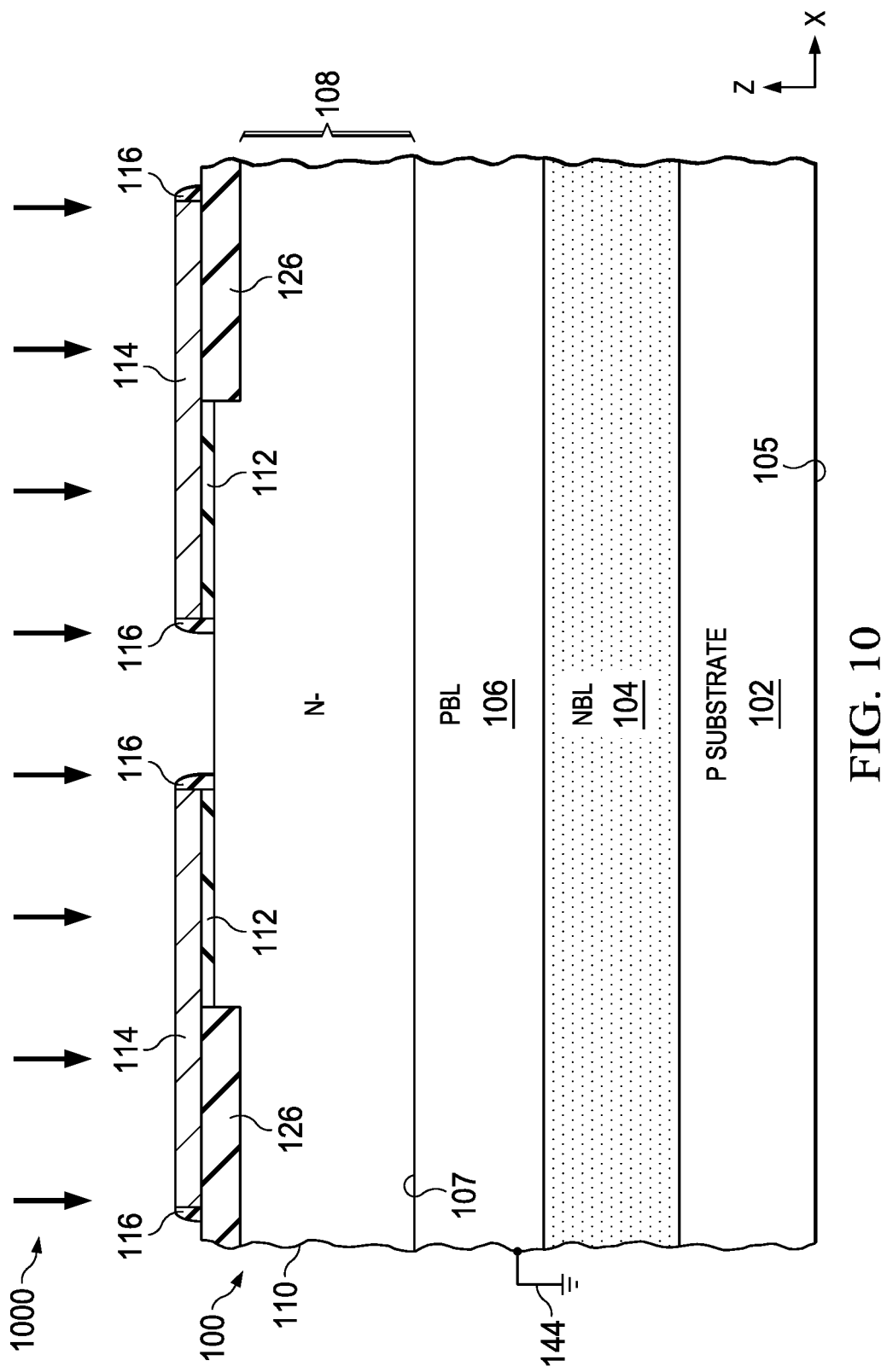

A gate mask 902 is formed at 512 as shown in FIG. 9, and a gate etch process 900 is performed that removes the exposed portions of the gate electrode polysilicon 324 layer 114 and the exposed SiON gate dielectric layer 112, leaving a patterned gate structure with top and sidewall surfaces exposed as shown in FIG. 9. Alternatively, the gate etch process 900 may leave some or all of the dielectric layer 112 above prospective source/drain regions of the silicon surface layer 108 (not shown). The gate mask 902 is then removed. In one example, shallow drain extension dopant implantations are performed (now shown) to introduce dopants into source/drain regions and into the patterned gate electrode polysilicon layer 114.

Figure 11:
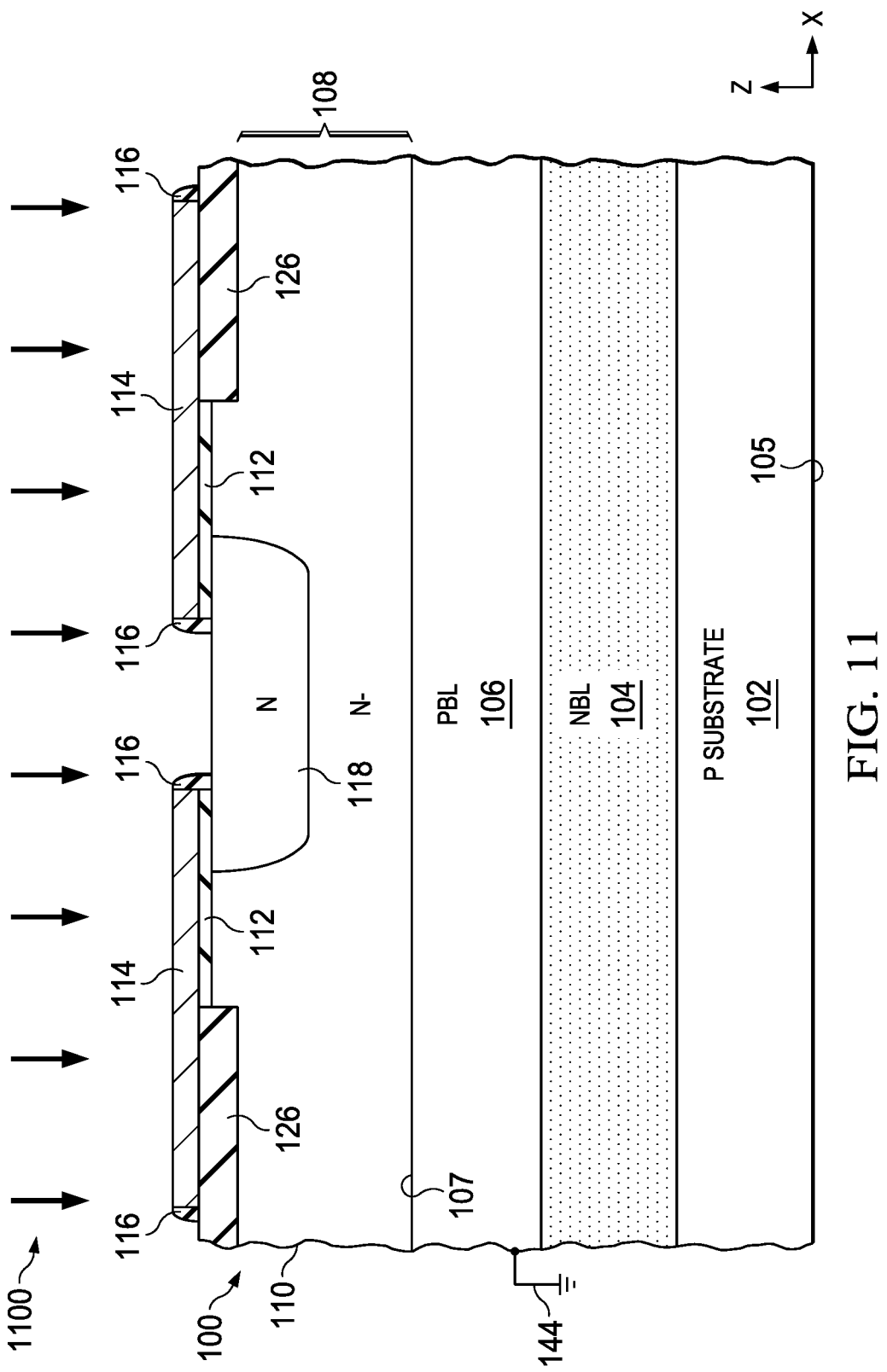

Sidewall spacers 116 are formed along the sidewalls of the patterned gate structure at 514 in FIG. 5 (e.g., process 1000 in FIG. 10) and source/drain implants are performed at 516 in FIG. 5. FIG. 11 shows one example, in which an implantation process 1100 is performed that implants phosphorus or other n-type dopants to form the doped region 118. In one example, the implantation process 1100 concurrently forms source/drain regions (not shown) for PMOS transistors of an IC implementation. As discussed above in connection with FIGS. 1-3, the implantation process 1100 implants dopants to form the first, second, third, and fourth doped regions 118 spaced apart from one another in the implanted region 110. As shown in FIGS. 1 and 3 above, the heavily doped shallow doped portions 119 are also formed at 516. In one example, heavily doped shallow doped portions 119 are formed at 514 by performing a further implantation process that implants dopants of the same conductivity type (e.g., N) to form first, second, third, and fourth heavily doped regions 119 within the respective first, second, third, and fourth doped regions 118. In one example, the first, second, third, and fourth heavily doped regions 119 have a higher carrier concentration than the respective first, second, third, and fourth doped regions (118). In one example, the further implantation process has a lower implantation energy than the second implantation process 1100 in order to form the first, second, third, and fourth heavily doped regions 119 to a depth less than the depth of the respective first, second, third, and fourth doped regions 118.

The method 500 also includes silicide processing is performed at 518 in FIG. 5 to form metal silicide gate contacts for the Hall sensor terminals at the top of the doped regions 118, 119, and also on the top sides of the polysilicon electrode layer 114. The method 500 also includes metallization processing at 520 to form one or more layers of dielectric with conductive metal features to provide interconnection for the Hall sensor terminals and and/or other components of the device 100. The process 500 in FIG. 5 also includes die singulation at 522 to separate one or more product dies from the wafer. The processing at 522 also includes packaging to provide one or more finished semiconductor devices, such as stand-alone components and/or integrated circuits.

Figure 12:
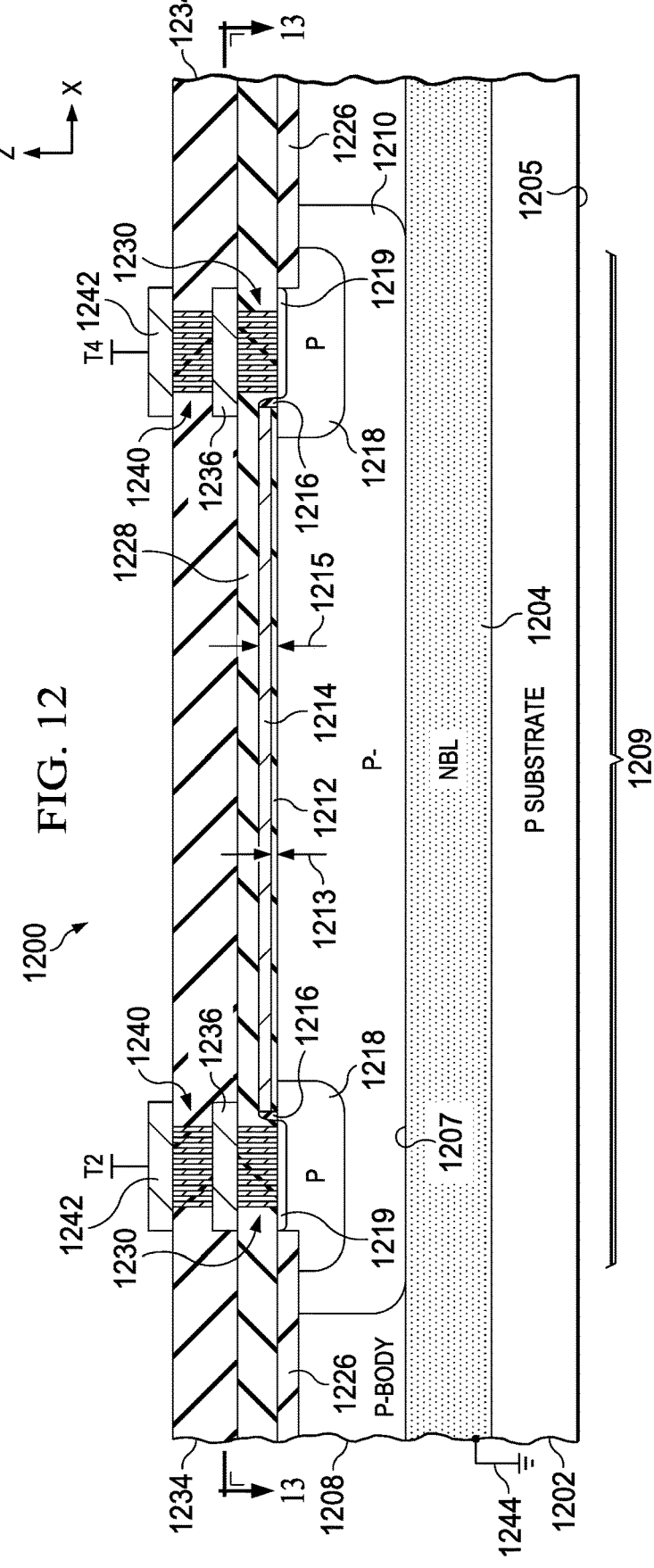
FIGS. 12 and 14 are partial sectional views of another integrated circuit semiconductor device with a Hall sensor that includes a p-doped Hall well or implanted region, p-doped access regions or doped regions, and a doped polysilicon control terminal.
Figure 13:
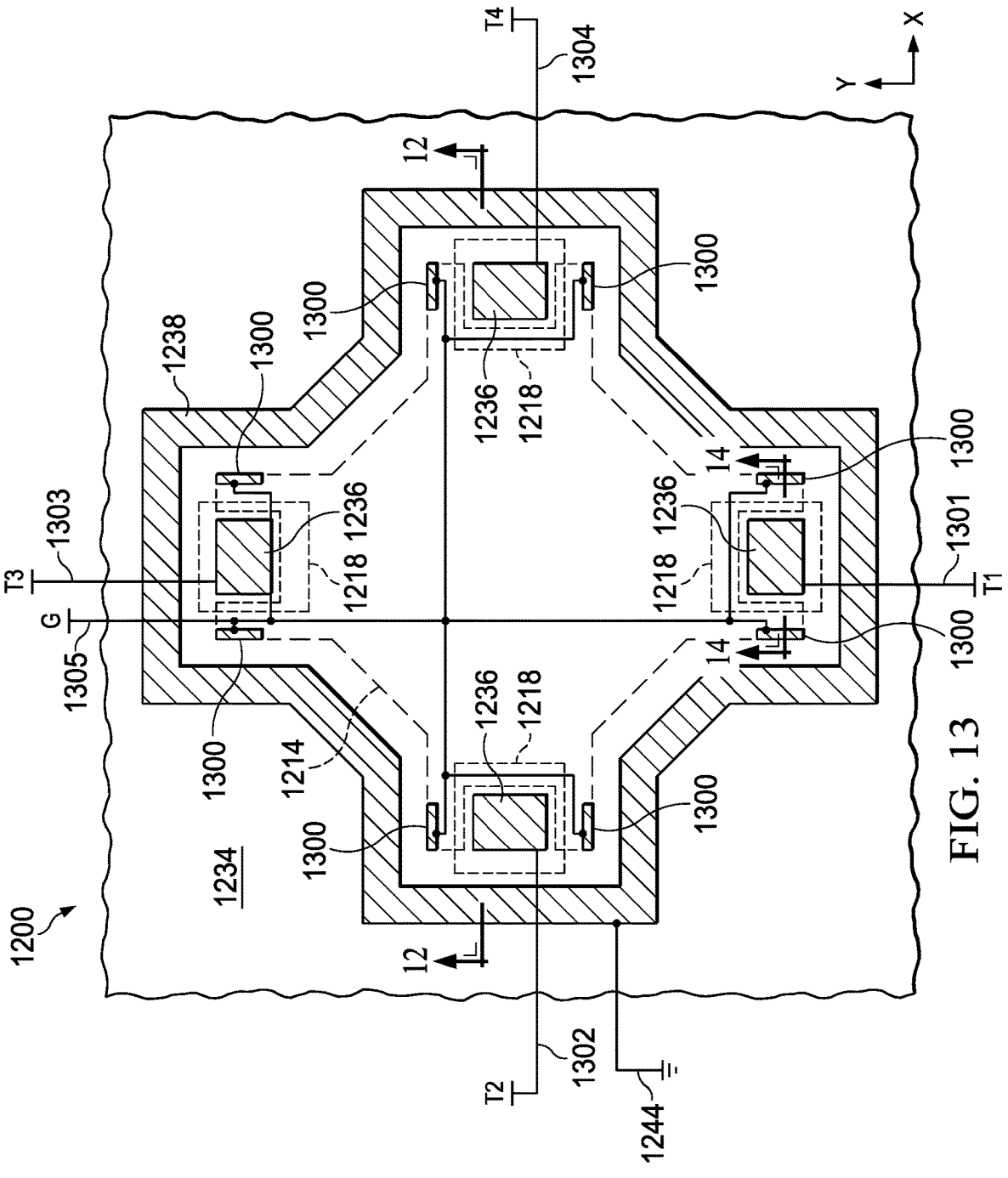
FIG. 13 is a top plan view of a portion of the semiconductor device of FIG. 12 taken along line 13-13 of FIG. 12.
Figure 14:
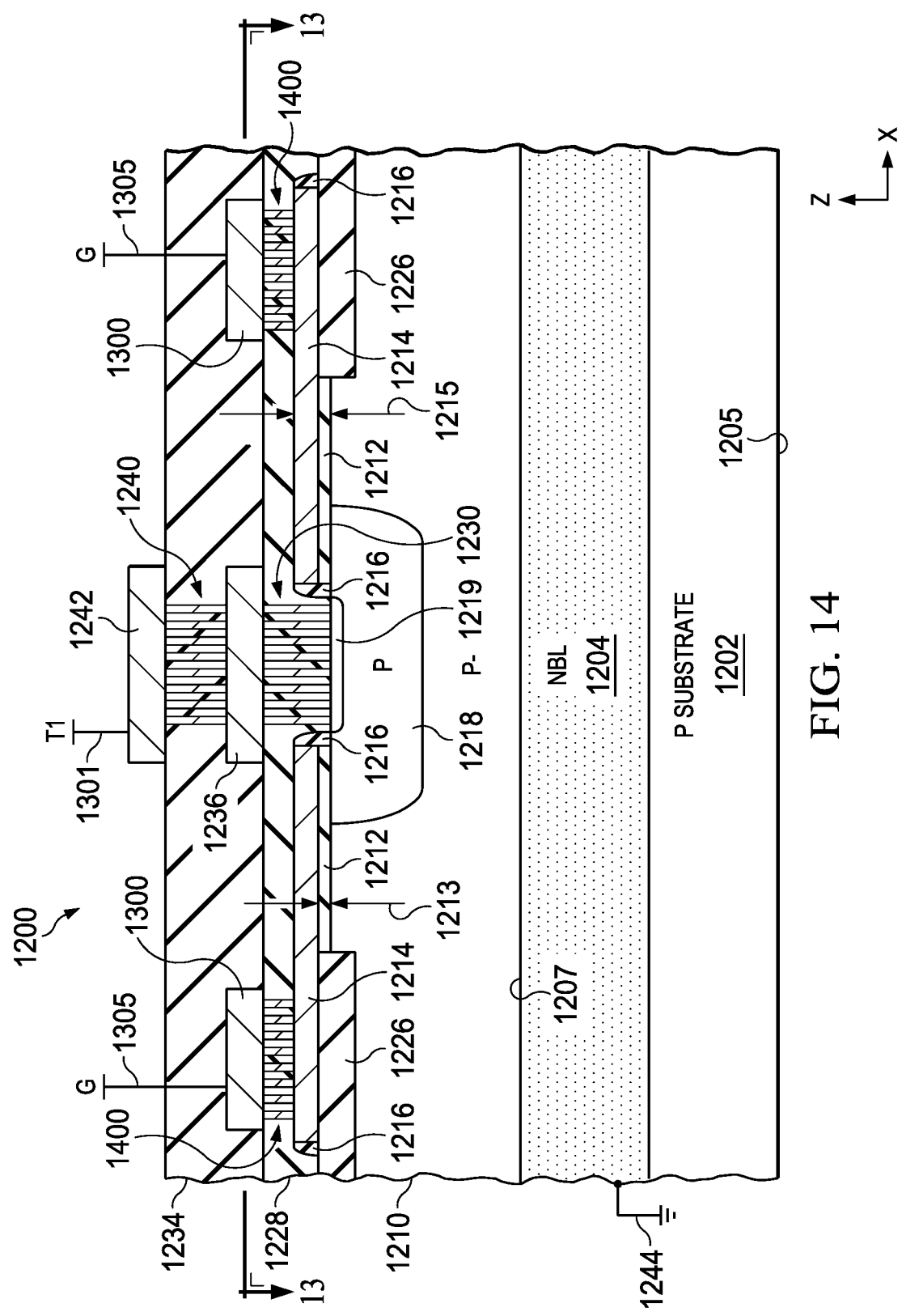

FIGS. 12-14 show another integrated circuit semiconductor device 1200 with a Hall sensor that includes a p-doped implanted region (Hall well), along with p-doped doped regions (access regions), and a doped polysilicon control terminal. FIG. 12 is a partial sectional side view of an example integrated circuit semiconductor device 1200 that includes a Hall sensor with a p-doped Hall well or implanted region 1210, p-doped doped regions 1218, 1219, and a doped polysilicon control terminal taken along line 12-12 of FIG. 13. FIG. 13 shows a sectional top view of a portion of the semiconductor device 1200 taken along line 13-13 of FIG. 12, and FIG. 14 is a partial sectional end view showing details of the control terminal of the semiconductor device 1200 taken along line 14-14 of FIG. 13. In this example, the semiconductor structure does not include the PBL layer as in the example of FIGS. 1-3, and various structures have opposite dopant conductivity types to those in the example of FIGS. 1-3. In other respects, the device 1200 is a controlled Hall sensor similar to the device 100 described above, where the structures and features 1202, 1204, 1205, 1207, 1208, 1210, 1212, 1213, 1214, 1215, 1216, 1218, 1219, 1226, 1228, 1230, 1234, 1236, 1240, 1242, 1244, 1300, 1301, 1302, 1303, 1304, 1305 and 1400 generally correspond to the above described structures and features 102, 104, 105, 107, 108, 110, 112, 113, 114, 115, 116, 118, 119, 126, 128, 130, 134, 136, 140, 142, 144, 200, 201, 202, 203, 204, 205 and 300, respectively, with suitable dopant conductivity types reversed. In this example, an isolation structure (not shown) can be made with connections to an NBL 1204 outside the partial section view of FIG. 12.

Figure 15:
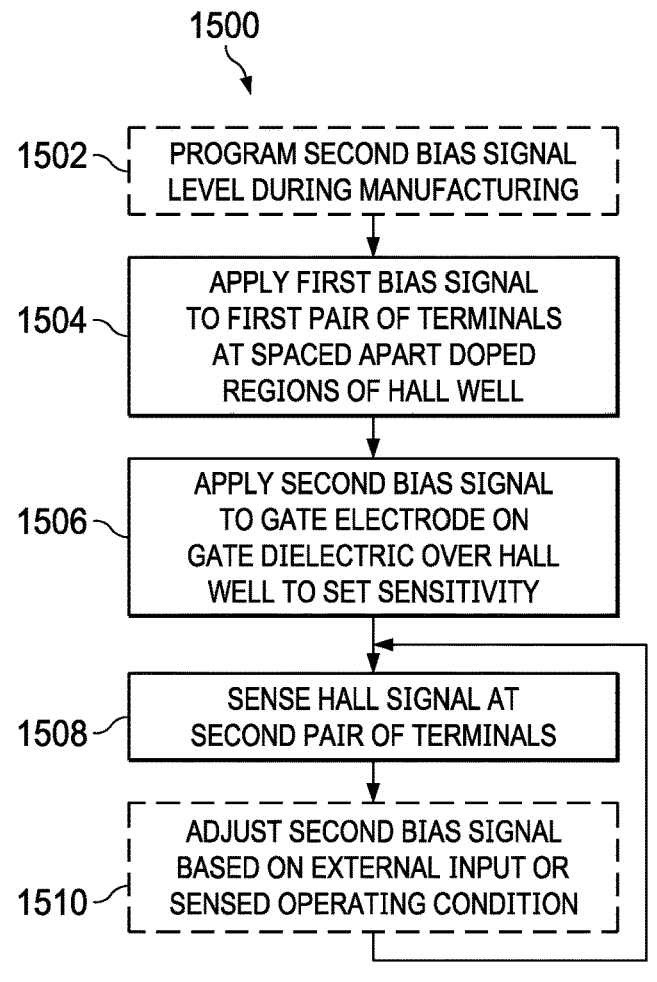
FIG. 15 is a flow diagram of a method of sensing a magnetic field.

FIG. 15 shows an example method 1500 of sensing a magnetic field. The method 1500 in one example includes programming a second bias signal level during manufacturing. In one example, the programming is implemented using one time programmable fuses or other elements of an IC implementation. In another example, the programming is done by writing a memory location or register in an IC implementation. In other example, the pre-programming at 1502 is omitted. The method 1500 also includes applying a non-zero first bias signal at 1504 to a first pair of terminals (e.g., first bias signal VDC applied to terminals T2 and T4 in FIG. 4 above, or a current bias signal can be used instead of a voltage signal) at first and second spaced apart doped regions (e.g., 118, 119) in an implanted region 110 of a semiconductor structure 102, 104, 106, 108. At 1506, the method 1500 in FIG. 15 also includes applying a non-zero second bias signal VCON at 1506 to the electrode layer 114 above the dielectric layer 112 on the implanted region 110. The method 1500 also includes sensing a Hall voltage signal (e.g., VH in FIG. 4 above) at 1508 at a second pair of terminals (e.g., terminals 201 and 203 at the third and fourth spaced apart doped regions 118, 119 in the implanted region 110.

Applying the second bias signal voltage VCON at 1506 to the additional polysilicon electrode layer 114 modulates the conductivity of the underlying Hall well implanted region 110 beneath the oxide layer 112. For example, the control signal VCON can be used to place the well implanted region 110 in depletion for higher sensitivity and low noise, or in accumulation for lower offset. In one example, the method 1500 also includes adjusting the non-zero second bias signal VCON at 1510 based on an external input or a sensed operating condition. The method 1500 then returns to sense the Hall signal at 1508 as described above. Our solution could enable unique, differentiated, Hall products by enabling dynamic modulation of Hall sensor performances over wide ranges.

Modifications are possible in the described embodiments, and other embodiments are possible, within the scope of the claims.

The following is claimed:

1. A method, comprising:
    performing a first implantation process that implants dopants to form an implanted region having a first conductivity type in a semiconductor surface layer over a semiconductor substrate that includes a buried layer having an opposite second conductivity type;
    performing a second implantation process that implants dopants to form first, second, third, and fourth doped regions having the first conductivity type spaced apart from one another in the implanted region, wherein the implanted region extends laterally directly between the first, second, third, and fourth doped regions at a top surface of the semiconductor surface layer;
    forming a dielectric layer over the implanted region; and

US 12,635,421 B2

13

14 forming an electrode layer over the dielectric layer that extends contiguously over the first, second, third, and fourth doped regions and includes five sides that at least partially overlap the first doped region.

2. The method of claim 1, further comprising performing a further implantation process that implants dopants of the first conductivity type to form first, second, third, and fourth heavily doped regions within the respective first, second, third, and fourth doped regions, the first, second, third, and fourth heavily doped regions having a higher carrier concentration than the respective first, second, third, and fourth doped regions.

3. The method of claim 2, wherein the further implantation process has a lower implantation energy than the second implantation process to form the first, second, third, and fourth heavily doped regions to a depth less than a depth of the respective first, second, third, and fourth doped regions.

4. The method of claim 1, wherein the first, second, third, and fourth doped regions are located at corners of a square.

5. The method of claim 1, further comprising forming first, second, third, and fourth contacts that electrically contact the respective first, second, third, and fourth doped regions.

6. The method of claim 1, wherein the dielectric layer has a non-zero thickness of 1200 Å (120 nm) or less.

7. The method of claim 6, wherein the thickness of the dielectric layer is in a range from 20 Å (2 nm) to 200 Å (20 nm).

8. The method of claim 1, wherein the dielectric layer is in contact with the implanted region, and wherein the electrode layer is in contact with the dielectric layer.

9. A method of forming a semiconductor device, comprising:

forming an epitaxial layer over a semiconductor substrate, the epitaxial layer including a semiconductor surface layer having a first conductivity type, a first buried layer having an opposite second conductivity type and a second buried layer having the first conductivity type between the semiconductor surface layer and the first buried layer, and implanting a dopant into the semiconductor surface layer thereby forming an implanted region, the implanted region extending to a top surface of the semiconductor surface layer and touching the second buried layer and having the second conductivity type and a first dopant concentration;

forming first, second, third, and fourth terminals that electrically contact the implanted region at respective first, second, third, and fourth locations spaced apart from one another, each of the first, second, third, and fourth terminals including a corresponding first doped portion having the second conductivity type and a second dopant concentration in a corresponding second doped portion having the second conductivity type and a third dopant concentration greater than the first dopant concentration, the second dopant concentration greater than the third dopant concentration and the implanted region extending directly between the second doped portions and the second buried layer;

forming a dielectric layer that touches the implanted region and the second doped portions; and forming a contiguous electrode layer that touches the dielectric layer and extends over the second doped portions, the electrode layer including five sides that overlap a first one of the second doped portions.

10. The method of claim 9, wherein the first, second, third, and fourth terminals are located at corners of a square.

11. The method of claim 9, wherein the first, second, third, and fourth terminals further include respective first, second, third, and fourth contacts that electrically contact the respective first, second, third, and fourth doped regions.

12. The method of claim 9, wherein the dielectric layer has a non-zero thickness of 1200 Å (120 nm) or less.

13. The method of claim 12, wherein the thickness of the dielectric layer is 20 Å (2 nm) or more.

14. The method of claim 12, wherein the thickness of the dielectric layer is in a range from 20 Å (2 nm) to 200 Å (20 nm).

15. The method of claim 9, wherein the dielectric layer is in contact with the implanted region, and wherein the electrode layer is in contact with the dielectric layer.

* * * * *